(12) United States Patent
Tanaka

(10) Patent No.: US 12,119,244 B2
(45) Date of Patent: Oct. 15, 2024

(54) SEMICONDUCTOR MANUFACTURING APPARATUS

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 338 days.

(21) Appl. No.: 17/501,774

(22) Filed: Oct. 14, 2021

(65) Prior Publication Data

US 2022/0328328 A1  Oct. 13, 2022

(30) Foreign Application Priority Data

Apr. 12, 2021 (JP) .................................. 2021-067257

(51) Int. Cl.
*H01L 21/67* (2006.01)
*H01L 21/306* (2006.01)
(Continued)

(52) U.S. Cl.
CPC .... *H01L 21/6708* (2013.01); *H01L 21/30604* (2013.01); *H01L 21/68764* (2013.01);
(Continued)

(58) Field of Classification Search
None
See application file for complete search history.

(56) References Cited

U.S. PATENT DOCUMENTS 4,668,334 A * 5/1987 Doornveld .............. G03F 7/162
438/758
8,043,467 B2 * 10/2011 Nanba ............... H01L 21/31055
156/345.55
(Continued)

FOREIGN PATENT DOCUMENTS

CN  108538750 A  9/2018
CN  111326440 A  6/2020
(Continued)

OTHER PUBLICATIONS

An Office Action issued by the German Patent and Trade Mark Office on Nov. 15, 2022, which corresponds to German Patent Application No. 102021132655.9 and is related to U.S. Appl. No. 17/501,774; with English language translation.
(Continued)

*Primary Examiner* — Sylvia MacArthur
(74) *Attorney, Agent, or Firm* — Studebaker & Brackett PC

(57) ABSTRACT

According to the present disclosure, a semiconductor manufacturing apparatus includes a rotation stage that rotates a wafer, a nozzle that supplies a chemical solution to the wafer and a nozzle movement section that moves the nozzle on a scan trajectory, wherein the nozzle movement section moves the nozzle along a first trajectory and a second trajectory on the scan trajectory, the first trajectory is a trajectory to turn around at a first turnaround point on one side and a second turnaround point on the other side with respect to a portion closest to a rotation axis of the rotation stage in the scan trajectory, and the second trajectory is a trajectory to turn around at a third turnaround point and a fourth turnaround point provided on the same side as the third turnaround point with respect to the portion closest to the rotation axis in the scan trajectory.

10 Claims, 11 Drawing Sheets

(51) Int. Cl.
 *H01L 21/687* (2006.01)
 *H01L 29/16* (2006.01)
 *H01L 29/20* (2006.01)

(52) U.S. Cl.
 CPC ...... *H01L 29/1602* (2013.01); *H01L 29/1608* (2013.01); *H01L 29/2003* (2013.01)

(56) References Cited

U.S. PATENT DOCUMENTS

| | | | | |
|---|---|---|---|---|
| 8,361,234 | B2* | 1/2013 | Izuta | H01L 21/67028 156/345.55 |
| 8,877,076 | B2* | 11/2014 | Negoro | H01L 21/31111 134/186 |
| 10,332,758 | B2* | 6/2019 | Nakamura | H01L 21/67028 |
| 10,985,038 | B2* | 4/2021 | Naohara | H01L 21/67051 |
| 2016/0086810 | A1 | 3/2016 | Fujiwara et al. | |
| 2016/0089686 | A1* | 3/2016 | Lee | H01L 21/6708 156/345.21 |
| 2017/0001221 | A1 | 1/2017 | Lee | |
| 2018/0254199 | A1 | 9/2018 | Suzuki et al. | |
| 2022/0328328 | A1* | 10/2022 | Tanaka | H01L 21/68764 |

FOREIGN PATENT DOCUMENTS

| | | |
|---|---|---|
| JP | 2016-063073 A | 4/2016 |
| JP | 2018-147923 A | 9/2018 |
| JP | 2020-77735 A | 5/2020 |
| KR | 10-2020-0075182 A | 6/2020 |

OTHER PUBLICATIONS

An Office Action; "Notice of Reasons for Refusal," mailed by the Japanese Patent Office on Jan. 30, 2024, which corresponds to Japanese Patent Application No. 2021-067257 and is related to U.S. Appl. No. 17/501,774; with English language translation.

An Office Action mailed by the State Intellectual Property Office of the People's Republic of China on May 20, 2024, which corresponds to Chinese Patent Application No. 202210362875.0 and is related to U.S. Appl. No. 17/501,774; with English language translation.

* cited by examiner

SEMICONDUCTOR MANUFACTURING APPARATUS

BACKGROUND OF THE INVENTION

Field

The present disclosure relates to a semiconductor manufacturing apparatus and a method of manufacturing a semiconductor device.

Background

JP 2018-147923 A discloses a substrate processing apparatus. The substrate processing apparatus includes a holding section, a rotation mechanism, a nozzle, a movement mechanism, and a control section. The holding section horizontally holds a substrate. The rotation mechanism rotates the holding section. The nozzle supplies an etchant to the substrate held by the holding section. The movement mechanism moves the nozzle. The control section controls the rotation mechanism and the movement mechanism, to perform scanning processing while supplying the etchant to the rotating substrate from the nozzle. In the scanning processing, a nozzle reciprocates between a first position above the substrate and a second position on the side closer to the outer periphery of the substrate than the first position. The control section performs the scanning processing a plurality of times while changing the first position.

In JP 2018-147923 A, a turnaround point of a scanning operation is provided in the vicinity of the center of a rotation axis. At this time, a singular point of an etching amount due to turnaround of the scanning operation may occur in the vicinity of the center of the rotation axis. The singular point is a portion where the etching amount more extremely changes than that in the periphery thereof. In the vicinity of the center of the rotation axis, a singular point of an etching amount due to an inflection point of a flow of a chemical solution easily appears. When to such a singular point is added the singular point due to the turnaround of the scanning operation, a profile of the etching amount in the vicinity of the center of the rotation axis may deteriorate. As a result, the residual thickness of an object to be etched may deviate from the standard, and the electrical characteristic of a semiconductor device may deteriorate.

SUMMARY

The present disclosure has been made to solve the above-described problem, and is directed to obtaining a semiconductor manufacturing apparatus and a method of manufacturing a semiconductor device capable of enhancing in-plane uniformity.

The features and advantages of the present disclosure may be summarized as follows.

According to an aspect of the present disclosure, a semiconductor manufacturing apparatus includes a rotation stage that rotates a wafer, a nozzle that supplies a chemical solution to a processing surface of the wafer; and a nozzle movement section that moves the nozzle on such a scan trajectory as to cross the processing surface in a planar view above the processing surface, wherein the nozzle movement section moves the nozzle along at least one first trajectory and at least one second trajectory on the scan trajectory so that the wafer is etched with the chemical solution, the at least one first trajectory is a trajectory to turn around at a first turnaround point on one side and a second turnaround point on the other side with respect to a portion closest to a rotation axis of the rotation stage in the scan trajectory, and the at least one second trajectory is a trajectory to turn around at a third turnaround point on the scan trajectory and a fourth turnaround point provided on the same side as the third turnaround point with respect to the portion closest to the rotation axis in the scan trajectory.

According to an aspect of the present disclosure, a method of manufacturing a semiconductor device includes loading a rotation stage with a wafer and moving, by a nozzle movement section that moves a nozzle on such a scan trajectory as to cross a processing surface of the wafer in a planar view above the processing surface while rotating the wafer using the rotation stage, the nozzle along a first trajectory and a second trajectory on the scan trajectory, to supply a chemical solution to the processing surface from the nozzle and etch the wafer, wherein the first trajectory is a trajectory to turn around at a first turnaround point on one side and a second turnaround point on the other side with respect to a portion closest to a rotation axis of the rotation stage in the scan trajectory, and the second trajectory is a trajectory to turn around at a third turnaround point on the scan trajectory and a fourth turnaround point provided on the same side as the third turnaround point with respect to the portion closest to the rotation axis in the scan trajectory.

Other and further objects, features and advantages of the disclosure will appear more fully from the following description.

DESCRIPTION OF EMBODIMENTS

Figure 1:
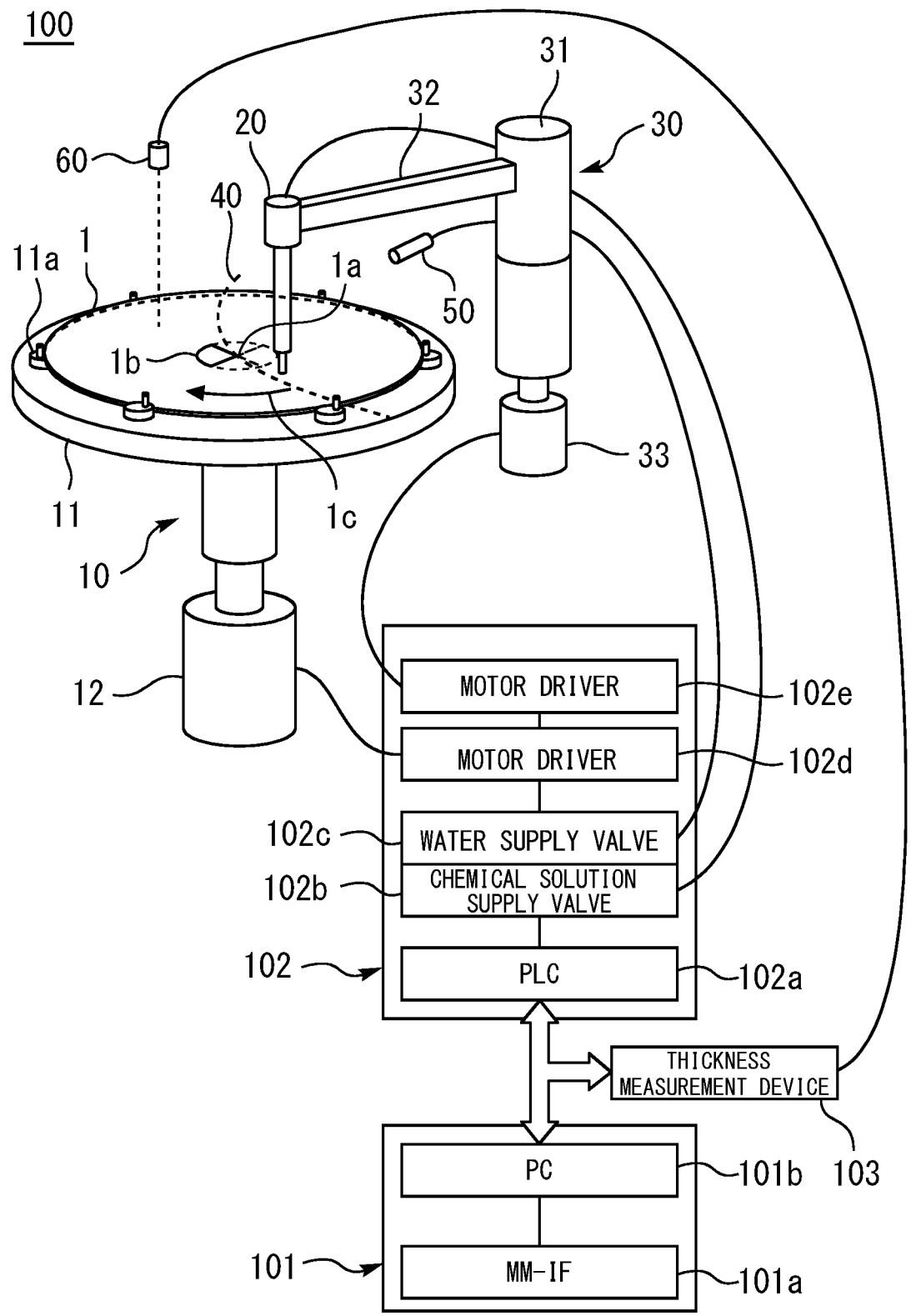
FIG. 1 is a perspective view of a semiconductor manufacturing apparatus according to a first embodiment.

A semiconductor manufacturing apparatus and a method of manufacturing a semiconductor device according to an embodiment of the present disclosure will be described with reference to the accompanying drawings. Components identical or corresponding to each other are indicated by the same reference characters, and repeated description of them is avoided in some cases.

First Embodiment

FIG. 1 is a perspective view of a semiconductor manufacturing apparatus 100 according to a first embodiment. The semiconductor manufacturing apparatus 100 is an apparatus for performing wet etching treatment. The semiconductor manufacturing apparatus 100 includes a rotation stage 11 that rotates a wafer 1. In an example illustrated in FIG. 1, the wafer 1 rotates in a rotation direction 1c around a rotation axis 1a. In a rotation mechanism section 10, the rotation stage 11 rotates by being connected to a rotation motor 12.

A wafer holding section 11a that holds the wafer 1 is incorporated into the rotation stage 11. The wafer holding section 11a is a chuck pin, for example. The wafer holding section 11a holds the wafer 1 to position the center thereof in the vicinity of the rotation axis 1a of the rotation stage 11 or on the rotation axis 1a of the rotation stage 11.

A nozzle 20 discharges a chemical solution, and supplies the chemical solution to a processing surface of the wafer 1. A nozzle movement section 30 includes a scan shaft 31, a scan arm 32, and a scan motor 33. The nozzle 20 is connected to the scan motor 33 via the scan shaft 31 and the scan arm 32. As a result, the nozzle movement section 30 moves the nozzle 20 on such a scan trajectory 40 as to cross the processing surface of the wafer 1 in a plan view above the processing surface of the wafer 1. The nozzle movement section 30 causes the nozzle 20 to perform scanning such that the nozzle 20 passes in the vicinity of the rotation axis 1a or on the rotation axis 1a. The nozzle movement section 30 rotationally moves, for example, the nozzle 20 in a direction along the processing surface of the wafer 1. In the present embodiment, the nozzle movement section 30 moves the nozzle 20 along a first trajectory and a second trajectory, described below, on the scan trajectory 40 so that the wafer 1 is etched with a chemical solution.

The semiconductor manufacturing apparatus 100 includes a water nozzle 50 that discharges water, a thickness measurement sensor 60, and a thickness measurement device 103 connected to the thickness measurement sensor 60. The semiconductor manufacturing apparatus 100 includes an operation PC 101 and a control PLC (programmable logic controller) 102.

The control PLC 102 includes a motor driver 102d for driving the rotation motor 12 and a motor driver 102e for driving the scan motor 33. The control PLC 102 includes a chemical solution supply valve 102b to be connected to the nozzle 20 and a water supply valve 102c to be connected to the water nozzle 50. An opening and closing instruction of the chemical solution supply valve 102b and the water supply valve 102c and an operation instruction to the motor drivers 102d and 102e are executed according to a series of control sequences managed by the PLC 102a. The control PLC 102 also performs control for peripheral mechanism units such as a load port, a conveyance robot, and a chemical solution supply unit not illustrated.

As a high-order system of the control PLC 102, the operation PC (personal computer) 101 is mounted. The operation PC 101 includes an MM-IF (man-machine interface) 101a and a PC 101b. The operation PC 101 performs FA (factory automation) communication with the high-order system.

A processing recipe is previously registered in the PC 101b via the MM-IF 101a. A recipe for processing the wafer 1 is selected in response to a recipe instruction by the MM-IF 101a and a recipe instruction by FA communication. The PC 101b reflects a content of the selected recipe on a parameter of a control sequence of the PLC 102a, to instruct the PLC 102a to start an operation. The PLC 102a executes a device control sequence with the reflected parameter.

Figure 2:
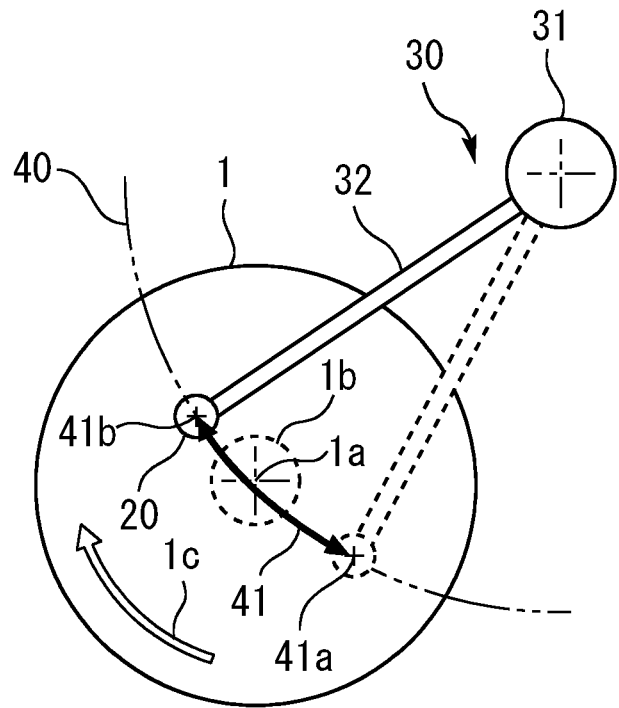
FIG. 2 is a diagram illustrating a first trajectory.

FIG. 2 is a diagram illustrating a first trajectory 41. Movement of the nozzle 20 along the first trajectory 41 on the scan trajectory 40 is hereinafter referred to as a first scanning operation. The first trajectory 41 is a trajectory to turn around at a first turnaround point 41a on one side and a second turnaround point 41b on the other side of a portion closest to the rotation axis 1a in the scan trajectory 40. In an example illustrated in FIG. 2, the scan trajectory 40 passes through the rotation axis 1a. Accordingly, the portion closest to the rotation axis 1a in the scan trajectory 40 is a portion on the rotation axis 1a. The first turnaround point 41a and the second turnaround point 41b are respectively provided on the opposite sides with respect to the rotation axis 1a on the scan trajectory 40. The first turnaround point 41a and the second turnaround point 41b are respectively provided at positions sufficiently spaced apart from the rotation axis 1a. The first scanning operation is repeatedly performed between the first turnaround point 41a and the second turnaround point 41b.

Figure 3:
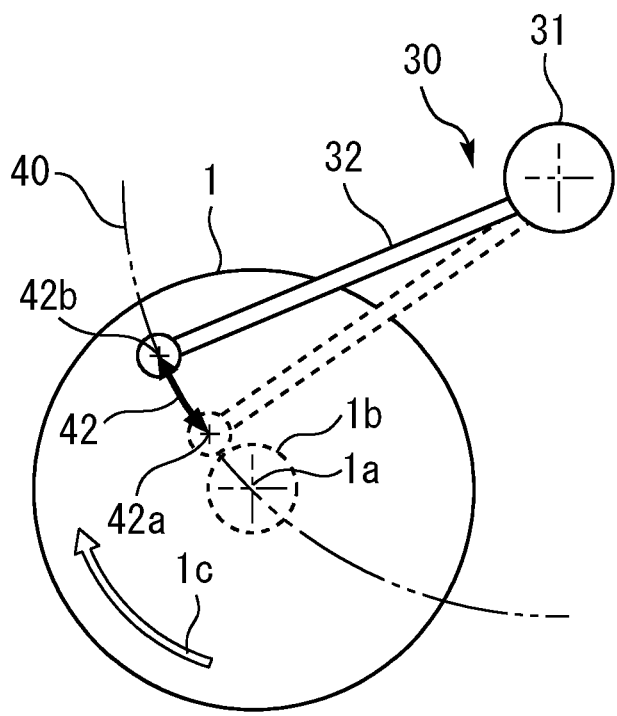
FIG. 3 is a diagram illustrating a second trajectory.

FIG. 3 is a diagram illustrating a second trajectory 42. Movement of the nozzle 20 along the second trajectory 42 on the scan trajectory 40 is hereinafter referred to as a second scanning operation. The second trajectory 42 is a trajectory to turn around at a third turnaround point 42a on the scan trajectory 40 and a fourth turnaround point 42b provided on the same side as the third turnaround point 42a with respect to a portion closest to the rotation axis 1a in the scan trajectory 40. The third turnaround point 42a and the fourth turnaround point 42b are provided on the same side with respect to the rotation axis 1a on the scan trajectory 40. The second scanning operation is repeatedly performed between the third turnaround point 42a and the fourth turnaround point 42b.

The first turnaround point 41a and the second turnaround point 41b are provided outside a central region 1b as a predetermined range from the rotation axis 1a in a planar view. The second trajectory 42 is provided outside the central region 1b in a planar view.

Figure 4:
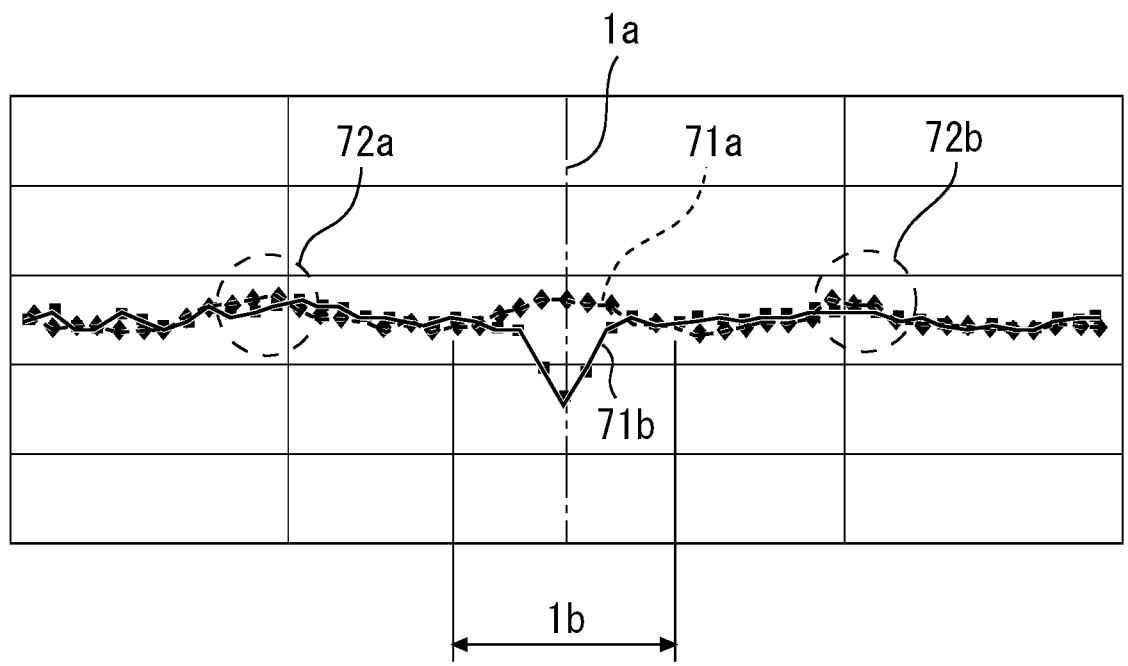
FIG. 4 is a diagram illustrating the central region.

FIG. 4 is a diagram illustrating the central region 1b. Data 71a and 71b respectively represent etching amounts when etching has been performed in the same first scanning operation. The data 71a is data in a state where the activity of a chemical solution to be used for etching is high. The data 71b is data in a state where the activity of a chemical solution to be used for etching is low. The activity is also referred to as reactivity. FIG. 4 illustrates data in a case where the first turnaround point 41a and the second turnaround point 41b are respectively at predetermined positions equally spaced apart from the rotation axis 1a.

Examples of an etching method include a method of always performing etching with a new chemical solution without recycling a chemical solution and a method of performing etching with a chemical solution to be recycled while replenishing a component of the chemical solution. In both the methods, etching is usually performed while maintaining the activity of the chemical solution. Accordingly, an etching amount almost constantly tends to more greatly change in the vicinity of the rotation axis 1a than that in the periphery thereof. Such a portion where a profile of an etching amount more extremely changes than that in the periphery thereof is represented by a singular point. To enhance uniformity of etching, an etching operation for complementing a singular point may be required.

As illustrated in FIG. 4, when etching is performed along the first trajectory 41, an etching amount increases or decreases as a distance from the rotation axis 1a increases. In the present embodiment, the central region 1b is a range from the rotation axis 1a to a location where the increase or decrease of the etching amount stops. In other words, the central region 1*b* is a range to a position where the increase or decrease of the etching amount from the rotation axis 1*a* changes to flatness.

Portions indicated by frames 72*a* and 72*b* illustrated in FIG. 4 are respectively singular points of etching amounts due to the first turnaround point 41*a* and the second turnaround point 41*b*. The second scanning operation is particularly effective to complement etching amounts by the first scanning operation outside the central region 1*b*.

Figure 5:
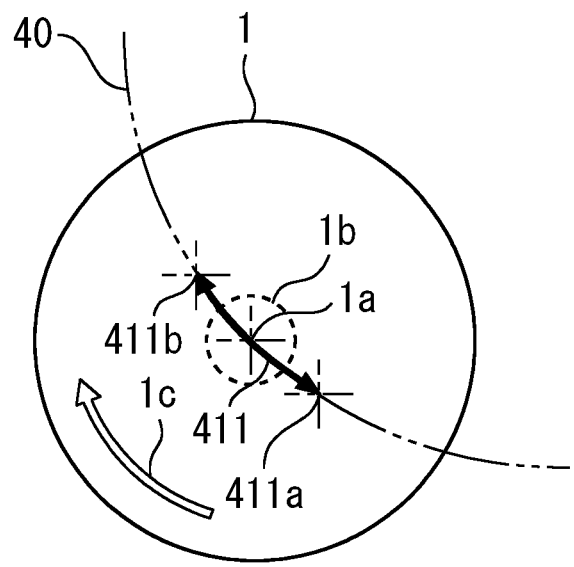
FIGS. 5 to 7 are diagrams respectively illustrating examples of the first trajectory.
Figure 6:
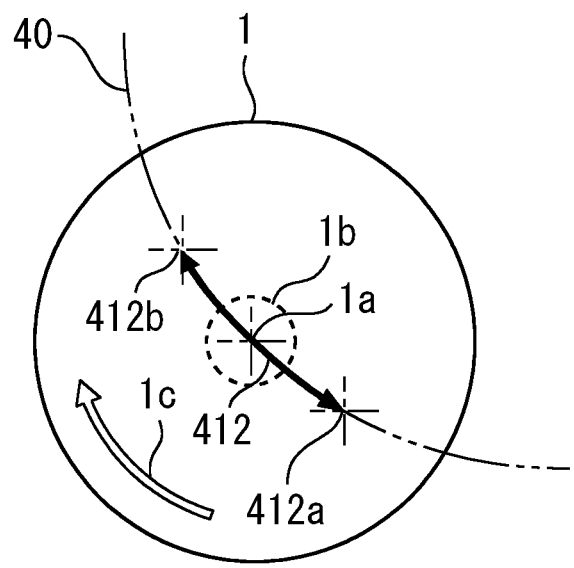
Figure 7:
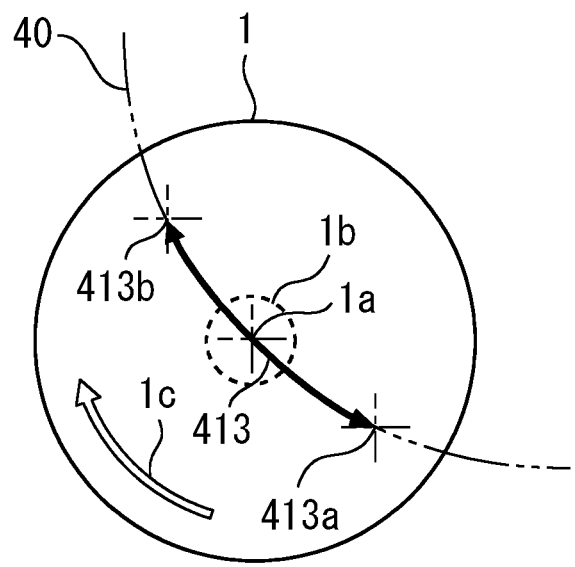

FIGS. 5 to 7 are diagrams respectively illustrating examples of the first trajectory 41. The first trajectory 41 includes three types of first trajectories 411, 412, and 413, for example. In the examples illustrated in FIGS. 5 to 7, a first turnaround point 411*a* and a second turnaround point 411*b* of the first trajectory 411 are equally spaced apart from the rotation axis 1*a*. Similarly, a first turnaround point 412*a* and a second turnaround point 412*b* of the first trajectory 412 are equally spaced apart from the rotation axis 1*a*, and a first turnaround point 413*a* and a second turnaround point 413*b* of the first trajectory 413 are equally spaced apart from the rotation axis 1*a*. The first trajectories 411, 412, and 413 increase in scanning operation range in this order.

Figure 8:
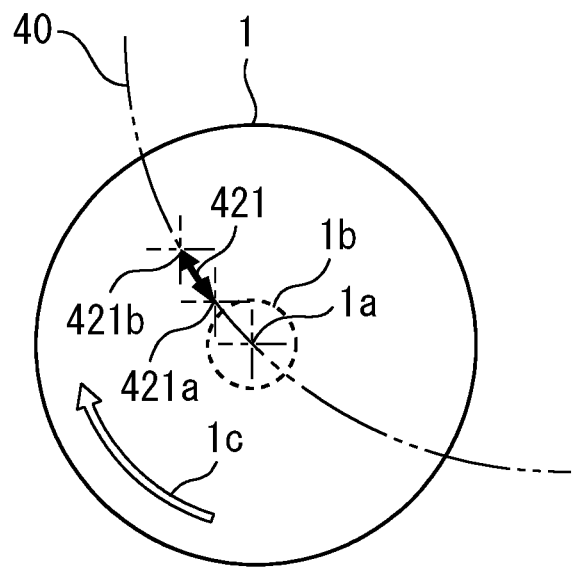
FIGS. 8 to 10 are diagrams respectively illustrating examples of the second trajectory.
Figure 9:
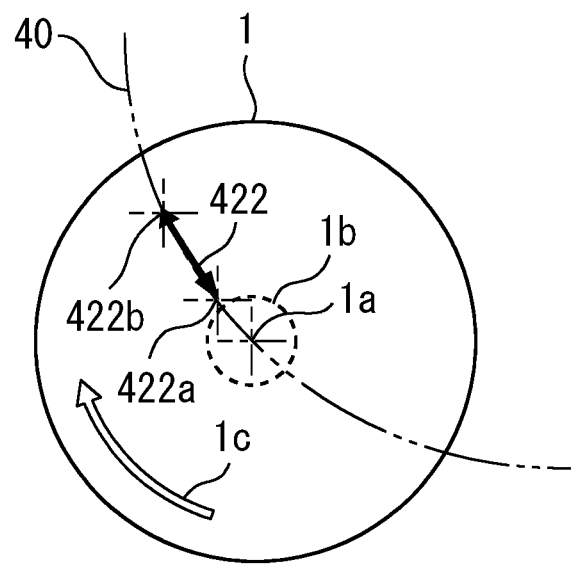
Figure 10:
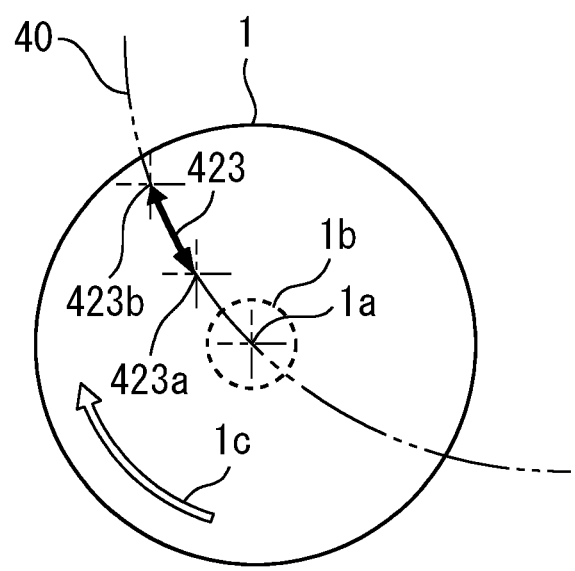
Figure 11:
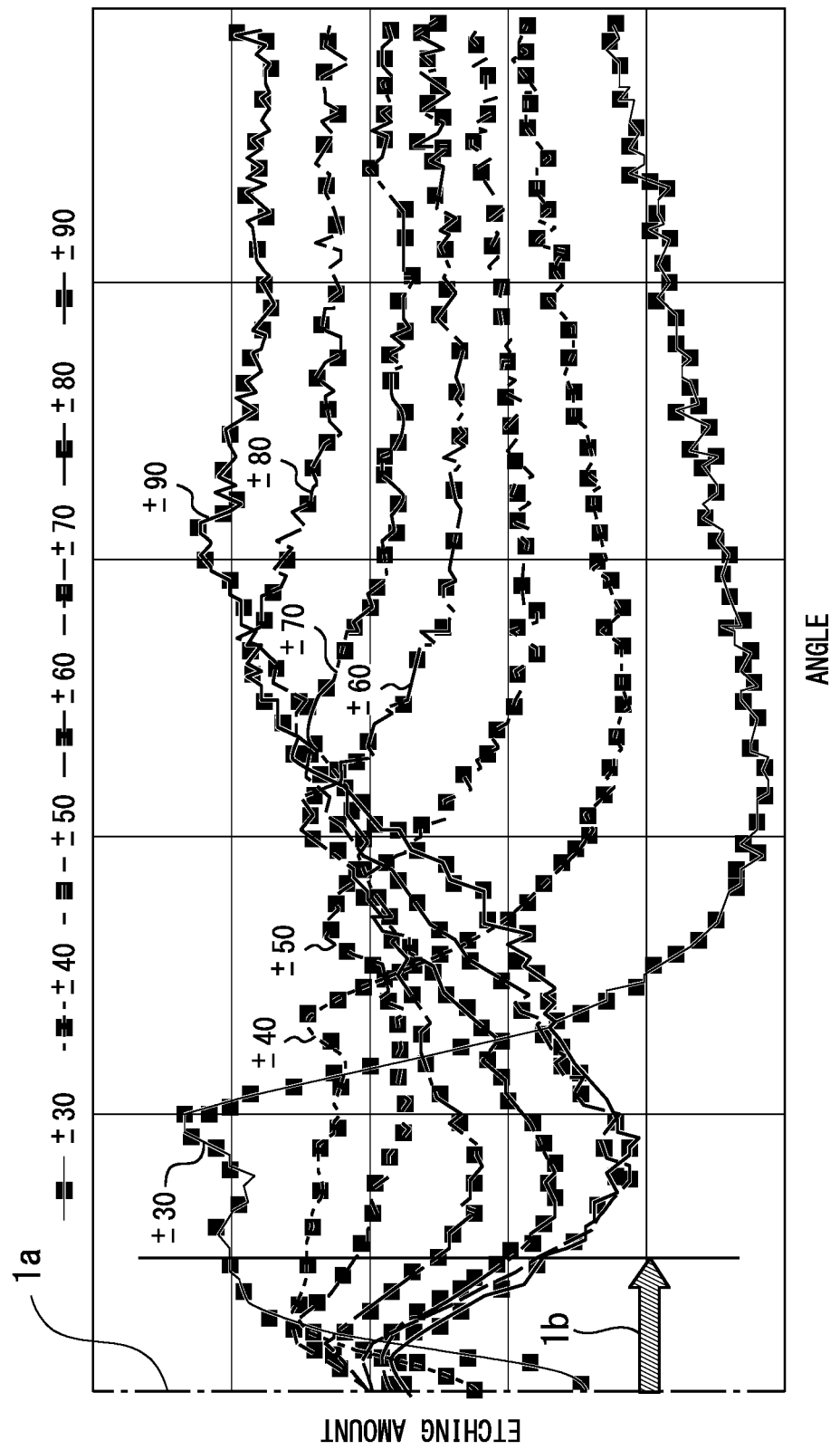
FIG. 11 is a diagram illustrating a profile of an etching amount along the first trajectory.

FIGS. 8 to 10 are diagrams respectively illustrating examples of the second trajectory 42. The second trajectory 42 includes three types of second trajectories 421, 422, and 423, for example. A third turnaround point 421*a* of the second trajectory 421 and a third turnaround point 422*a* of the second trajectory 422 are at the same positions. A fourth turnaround point 422*b* of the second trajectory 422 is farther away from the rotation axis 1*a* than a fourth turnaround point 421*b* of the second trajectory 421. A third turnaround point 423*a* of the second trajectory 423 is farther away from the rotation axis 1*a* than the third turnaround point 422*a* of the second trajectory 422. A fourth turnaround point 423*b* of the second trajectory 423 is farther away from the rotation axis 1*a* than the fourth turnaround point 422*b* of the second trajectory 422. FIG. 11 is a diagram illustrating a profile of an etching amount along the first trajectory 41.

FIG. 11 illustrates etching amounts in a case where the first scanning operation has been performed along seven types of first trajectories 41. In FIG. 11, ±30, for example, means that a range from −30 to +30 is scanned on the scan trajectory 40 with the rotation axis 1*a* set to zero.

Figure 12:
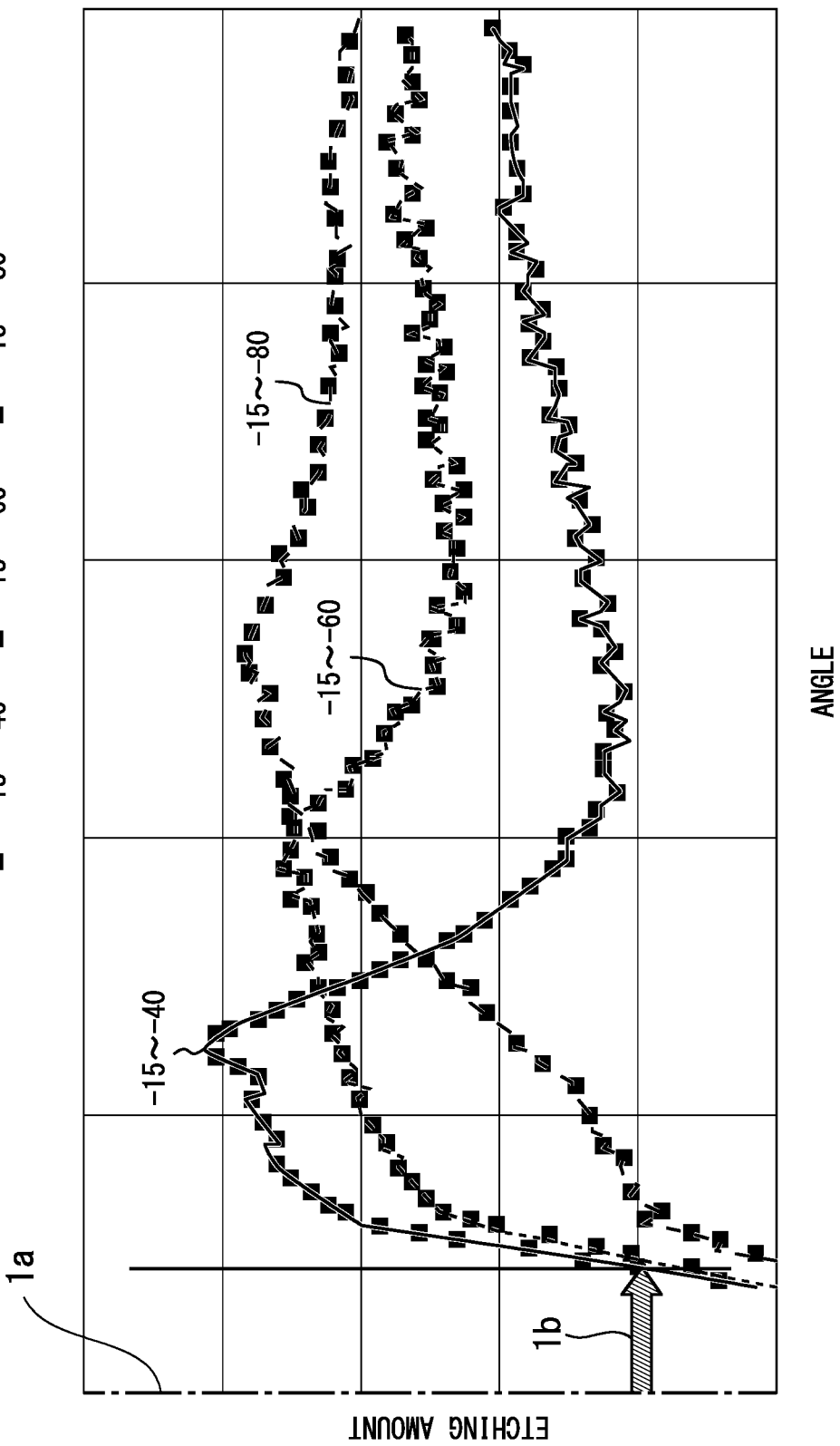
FIG. 12 is a diagram illustrating a profile of an etching amount along the second trajectory.

FIG. 12 is a diagram illustrating a profile of an etching amount along the second trajectory 42. FIG. 12 illustrates etching amounts in a case where the second scanning operation has been performed along three types of second trajectories 42. In FIG. 12, −15 to −40, for example, means that a range from −15 to −40 is scanned on the scan trajectory 40 with the rotation axis 1*a* set to zero.

In FIGS. 11 and 12, a left end indicates the rotation axis 1*a*, and a profile corresponding to a radius is illustrated. In the profile by the first scanning operation illustrated in FIG. 11, a range until an increase in etching amount from the rotation axis 1*a* changes to flatness at a profile of ±30 is widest. In an example illustrated in FIG. 11, the central region 1*b* is set based on a profile of ±30.

In the second scanning operation illustrated in FIG. 12, all third turnaround points 42*a* are set at a position of −15 outside the central region 1*b*. In FIG. 12, an etching amount is also inclined in the central region 1*b*. The reason for this is that such a flow as to spread a chemical solution into the central region 1*b* has occurred at the position of −15.

Figure 13:
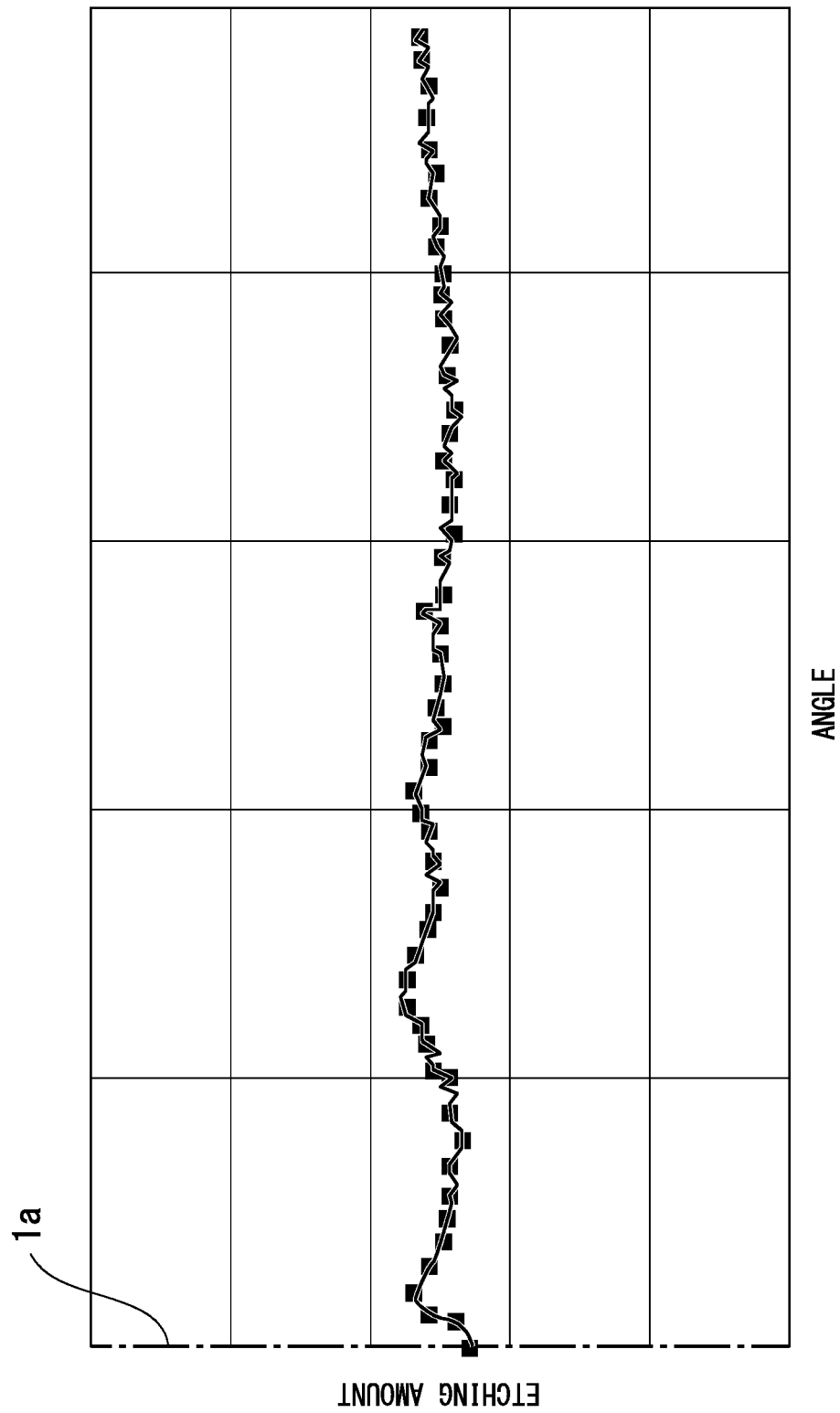
FIG. 13 is a diagram illustrating an average value of etching amounts along a plurality of combinations of the first trajectories 41 and the second trajectories.

FIG. 13 is a diagram illustrating an average value of etching amounts along a plurality of combinations of the first trajectories 41 and the second trajectories 42. One or more of seven types of first scanning operations and three types of second scanning operations respectively illustrated in FIGS. 11 and 12 are selected, and the selected scanning operations are combined with one another in units of 10 percent. That is, etching is performed for combinations obtained by switching a ratio of the selected scanning operations to an etching process in units of 10 percent. FIG. 13 illustrates a result of averaging etching amounts by the 10 combinations having high uniformity in etching amount among the combinations. Respective ordinate and abscissa scales are respectively the same as those illustrated in FIGS. 11 and 12.

Any one of the ten combinations includes four types of scanning operations: ±40, ±60, and ±80 among the first scanning operations and −15 to −40 among the second scanning operations. The other types of scanning operations do not exhibit effectiveness for enhancing etching uniformity. It goes without saying that the scanning operation exhibiting effectiveness changes depending on various types of conditions. Examples of the various types of conditions include a diameter of the wafer 1, a number of revolutions of the wafer 1, a speed of a scanning operation, activity of a chemical solution, a discharge flow rate of a chemical solution, range setting of the central region 1*b*, a position of a turnaround point for each scan, and a combination unit.

Thus, in the present embodiment, in-plane uniformity can be enhanced by combinations of the first trajectories 41 and the second trajectories 42. A singular point of an etching amount due to an inflection point of a flow of a chemical solution easily appears in the vicinity of the rotation axis 1*a*. The singular point can be suppressed by the first scanning operation. In this case, parameters such as a number of revolutions of the wafer 1, a scan range, a scan speed, and a discharge flow rate of a chemical solution may be optimized.

At a position spaced apart from the rotation axis 1*a*, a profile of an etching amount tends to change from a decrease to an increase toward the outer periphery from the center side. Accordingly, in-plane uniformity may deteriorate by being dragged by a portion where an etching amount is small. The second scanning operation enables the etching amount in the portion where the etching amount is small to be compensated for. In this case, parameters such as a number of revolutions of the wafer 1, a scan range, a scan speed, and a discharge flow rate of a chemical solution may be optimized.

A profile of an etching amount in the vicinity of the rotation axis 1*a* may deteriorate by adding a singular point due to turnaround of a scanning operation to a singular point in the vicinity of the rotation axis 1*a*. On the other hand, in the present embodiment, if there is no turnaround point in the central region 1*b*, the singular point of the etching amount due to the turnaround point of the scanning operation can be eliminated from the central region 1*b*. Therefore, in-plane uniformity can be further enhanced. Reproducibility of a profile in the central region 1*b* can be enhanced. The central region 1*b* is not limited to that in the example illustrated in FIG. 4, but may be appropriately set as a predetermined range from the rotation axis 1*a*.

The nozzle movement section 30 may move the nozzle 20 along a plurality of first trajectories 41 that differ in the first turnaround point 41*a* or the second turnaround point 41*b*. The nozzle movement section 30 may move the nozzle 20 in a plurality of second trajectories 42 that differ in the third turnaround point 42*a* or the fourth turnaround point 42*b*. When a position of the turnaround point is changed in the first and second scanning operations, an effect of a singular point can be dispersed. Therefore, uniformity of etching can be further enhanced.

In the present embodiment, scanning may be performed while a position is changed for the fourth turnaround point 42b on the side farther away from the rotation axis 1a of the second trajectory 42. As a result, an effect of a singular point on an etching amount due to a turnaround point of a scanning operation can also be suppressed at a position farther away from the rotation axis 1a.

Figure 14:
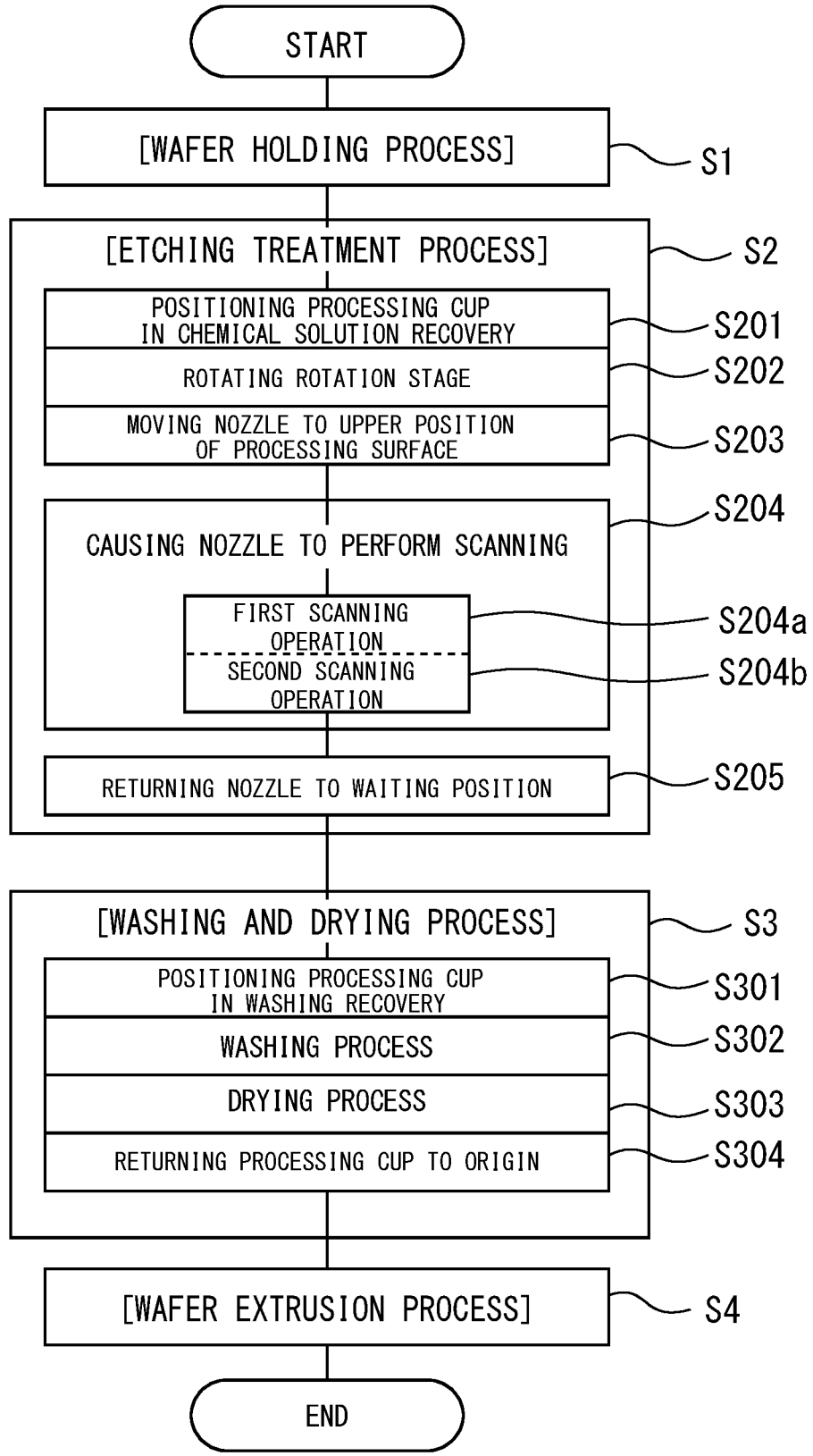
FIG. 14 is a diagram illustrating an etching process.

FIG. 14 is a diagram illustrating an etching process. First, a wafer holding process is performed (step1). The nozzle 20 is at a waiting position, a processing cup not illustrated is at an origin, the rotation stage 11 is at an origin, and a chuck pin as the wafer holding section 11a is in an open state. In this state, the rotation stage 11 is loaded with the wafer 1. Specifically, a conveyance robot not illustrated that holds the wafer 1 introduces the wafer 1 onto the rotation stage 11. Then, the chuck pin is closed, to hold the wafer 1 in the wafer holding section 11a.

Then, an etching treatment process is performed (step2). First, the processing cup is positioned in chemical solution recovery (step 201). Then, the rotation motor 12 rotates the rotation stage 11 in the rotation direction 1c (step202). Then, the nozzle 20 fixed to the scan arm 32 is moved to an upper position with respect to a processing surface by up-down movement of the scan shaft 31 and rotational movement of the scan motor 33 (step203). Then, a scanning process is performed (step204). In the scanning process, the nozzle 20 is caused to perform scanning by the rotational movement of the scan motor 33 to match chemical solution discharge. The operation PC 101 and the control PLC 102 are each a control section that controls the nozzle movement section 30 in response to a processing recipe including a plurality of steps. The first turnaround point 41a and the second turnaround point 41b or the third turnaround point 42a and the fourth turnaround point 42b can be set for each of the plurality of steps in the control section. A scanning operation of the nozzle 20 uses the two turnaround points set for each of the plurality of steps constituting the processing recipe as an operation range.

Step204 includes step204a in which a first scanning operation is performed and a step204b in which a second scanning operation is performed. In step204, the nozzle 20 is moved along the first trajectory 41 and the second trajectory 42 above the processing surface of the wafer 1 while the wafer 1 is being rotated by the rotation stage 11. As a result, a chemical solution is supplied to the processing surface of the wafer 1 from the nozzle 20, to etch the wafer 1.

The type of scanning operation and the order of steps can be set depending on the role of each of the scanning operations. For example, if etching is prevented from varying in the vicinity of the rotation axis 1a, the first scanning operation may be performed, starting with the second scanning operation. In this case, etching can be prevented from varying by suppressing etching in the vicinity of the rotation axis 1a during transition to the first scanning operation. If etching is finished using detection of an etching end point, the etching end point is detected while the thickness of an object to be etched is consecutively measured by the thickness measurement sensor 60 and the thickness measurement device 103. A scanning operation in the final step relating to the etching end point may be a scanning operation having the best uniformity among scanning operations in the plurality of steps constituting the processing recipe. That is, the nozzle movement section 30 moves the nozzle 20 along at least one first trajectory 41 and at least one second trajectory 42 in order, and finally moves the nozzle 20 along the trajectory having the best uniformity among the at least one first trajectory 41 and the at least one second trajectory 42. As a result, an effect of a variation at the etching end point on the uniformity can be suppressed.

After step204, the nozzle 20 is returned to the waiting position by up-down movement of the scan shaft 31 and rotational movement of the scan motor 33 (step205). Then, a washing and drying process is performed (step3). The processing cup is first positioned in washing recovery (step301). Then, water is discharged to the vicinity of the rotation axis 1a from the water nozzle 50, to perform washing processing (step302). Then, the rotation stage 11 is rotated at high speed by the rotation motor 12, to perform shake-off drying processing (step303). Then, the rotation of the rotation stage 11 is stopped, to return the processing cup to the origin (step304).

Then, a wafer extrusion process is performed (step4). The chuck pin is opened, to extrude the wafer 1 using the conveyance robot. These series of processes make it possible to subject the wafer 1 to etching treatment having high uniformity.

In the present embodiment, etching of the wafer 1 by the first trajectory 41 and etching of the wafer 1 by the second trajectory 42 are consecutively performed. Accordingly, the productivity efficiency can be prevented from decreasing because the number of processes increases. A chemical solution for etching may decrease in activity by continuing to be used. In the present embodiment, when the first scanning operation and the second scanning operation are collectively performed, the first scanning operation and the second scanning operation can be considered to be being respectively performed under similar chemical solution conditions. Accordingly, an acceptable range of deterioration of the chemical solution can be easily judged. A correction coefficient of a processing time period can be set depending on the deterioration of the chemical solution. In this case, the same correction coefficient can also be used in the first scanning operation and the second scanning operation. Therefore, manufacturing processes can be simplified.

Figure 15:
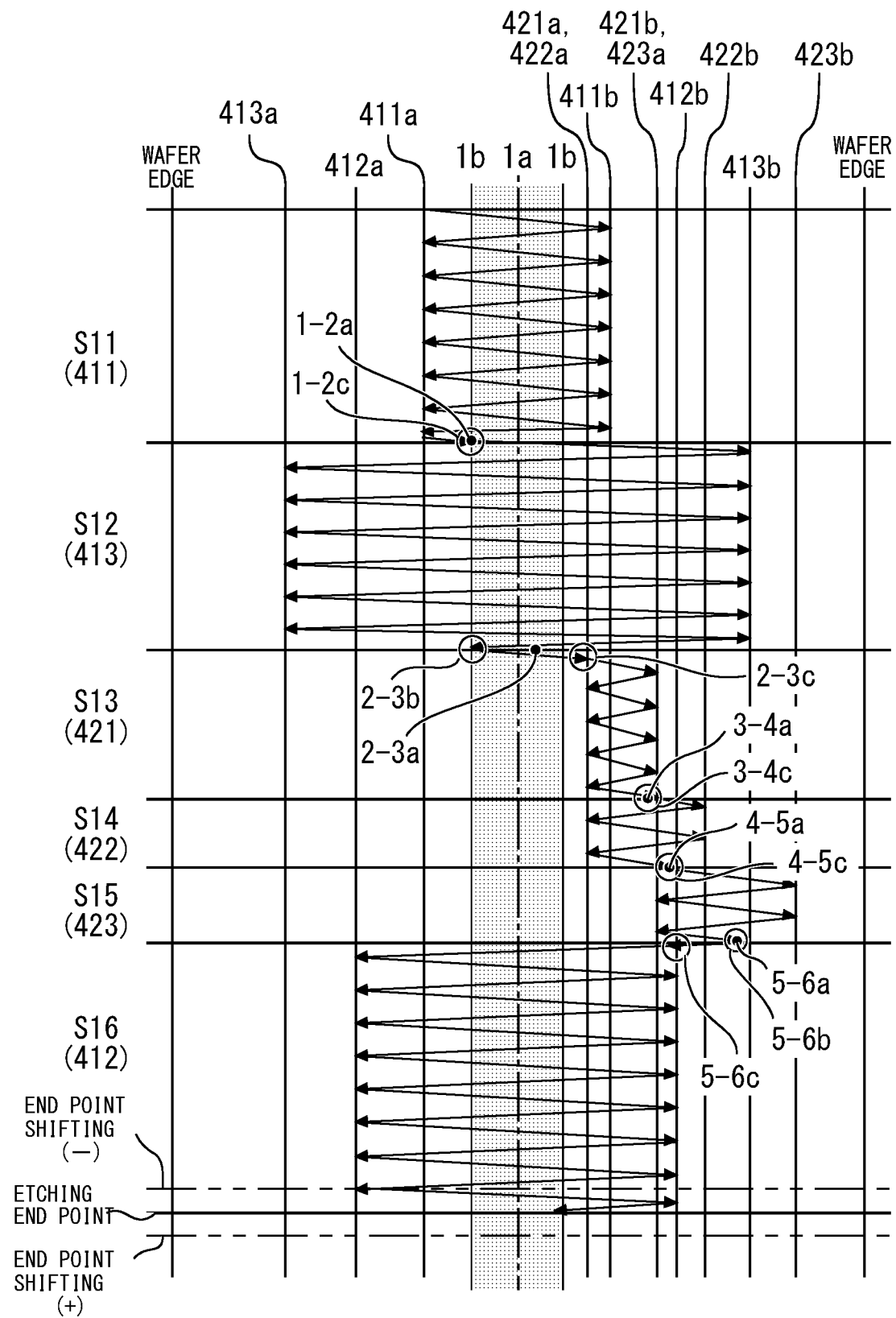
FIG. 15 is a diagram illustrating a plurality of steps constituting the scanning process.

FIG. 15 is a diagram illustrating a plurality of steps11 to 16 constituting the scanning process. FIG. 15 illustrates an example of a plurality of steps relating to the scanning process in a time series. FIG. 15 illustrates a time change of a position of the nozzle 20. In an example illustrated in FIG. 15, the scanning operations illustrated in FIGS. 5 to 10 are combined with one another.

The first scanning operation by the first trajectory 411, the first scanning operation by the first trajectory 413, and the second scanning operation by the second trajectory 421 are respectively performed in step11, step12, and step13. The second scanning operation by the second trajectory 422, the second scanning operation by the second trajectory 423, and the first scanning operation by the first trajectory 412 are respectively performed in step14, step15, and step16.

To switch the steps in the scanning process, the plurality of first trajectories 41 that differ in the first turnaround point 41a or the second turnaround point 41b or the plurality of second trajectories 42 that differ in the third turnaround point 42a or the fourth turnaround point 42b may be switched. Further, to switch the steps, the first trajectories 41 and the second trajectories 42 may be switched. If there is a turnaround point of the trajectory after the switching in the movement direction of the nozzle 20 when the trajectories are switched, the nozzle movement section 30 causes the nozzle 20 to turn around at the turnaround point. If there is no turnaround point of the trajectory after the switching in the movement direction of the nozzle 20 when the trajectories are switched, the nozzle movement section 30 causes the nozzle 20 to turn around at a time point where the nozzle goes out of the central region 1b.

At an end point 1-2a in step11, a second turnaround point 413b in step12 exists in the movement direction of the nozzle 20. Accordingly, the nozzle 20 does not turn around at the end point 1-2a, but is operated with the end point 1-2a changed to a start point 1-2c of a scanning operation in step12 as it is.

At an end point 2-3a in step12, a turnaround point in step13 does not exist in the movement direction of the nozzle 20. Accordingly, the nozzle 20 turns around at a point 2-3b outside the central region 1b. As a result, a third turnaround point 421a in step13 is changed to a start point 2-3c of a scanning operation in step13. Between the end point 2-3a and the start point 2-3c, step13 has already progressed. However, a scanning operation with a movement speed in step12 kept is performed.

At an end point 3-4a in step13 and an end point 4-5a in step14, there is a turnaround point in the subsequent step in the movement direction of the nozzle 20, like at the end point 1-2a in step11. Accordingly, the end point 3-4a and 4-5a are respectively changed to start points 3-4c and 4-5c of a scanning operation in the subsequent step.

At an end point 5-6a in step15, there is no turnaround point in step16 in the movement direction of the nozzle 20. However, the nozzle 20 has already been outside the central region 1b, and therefore immediately turns around at a point 5-6b. As a result, a second turnaround point 412b in step16 becomes a start point 5-6c of a scanning operation in step16. Step16 has already progressed between the end point 5-6a and the start point 5-6c. However, a scanning operation with a movement speed in step15 kept is performed.

Such an operation enables, even when a position of the nozzle 20 is in the middle of a trajectory at the end of the step, the steps to be smoothly connected to one another. When the steps are switched, the steps can be smoothly connected to one another without the nozzle 20 being returned to the origin. Accordingly, singular points due to the connection among the steps can be suppressed.

When detection of an etching end point is used as a method of finishing etching, a processing time period in a final step may vary. The variation is indicated as end point shifting (−) and end point shifting (+) in FIG. 15. Accordingly, the scanning operation in step16 as the final step relating to the etching end point may be set as a scanning operation having the best uniformity among the steps S11 to 16. In the example illustrated in FIG. 15, the scanning operation having the best uniformity is the first scanning operation by the first trajectory 412. As a result, an effect of a variation at the etching end point on uniformity can be suppressed.

A configuration of the semiconductor manufacturing apparatus 100 according to the present embodiment is not limited to the configurations so far described. For example, the nozzle movement section 30 is not limited to a rotation mechanism, but may be a translatory mechanism. That is, the nozzle 20 may perform translatory movement above the wafer 1. The wafer holding section 11a may be not a chuck pin but a vacuum chuck. The number of chemical solutions used for etching is not limited to one, but may be plural. In this case, a plurality of nozzles 20 may be provided to handle a plurality of chemical solutions. The plurality of nozzles 20 may respectively separately or independently perform scanning operations, or may perform scanning operations simultaneously or in an associated manner with each other. In this case, a similar effect to that in the present embodiment can also be obtained by combining the first scanning operation and the second scanning operation.

Examples of an object to be etched include Si as a base material of a semiconductor wafer and a film formed on a surface of the semiconductor wafer. Examples of the film include $SiO_2$-based, SiN-based, organic-based, and metal-based films. Examples of a chemical solution used for etching include inorganic acid-based, inorganic base-based, and organic-based liquids. Specifically, as the chemical solution, a mixed solution of HF and $HNO_3$ for etching Si and HF or BHF for etching $SiO_2$ based material, and $H_3PO_4$ for etching SiN based material, for example, can be used. In any chemical solution, uniformity can be enhanced by combining the first scanning operation and the second scanning operation.

The wafer 1 may be made with a wide bandgap semiconductor. An example of the wide bandgap semiconductor is silicon carbide, a gallium nitride-based material, or diamond. The present embodiment makes it possible to prevent the electrical characteristic of the wafer 1 from deteriorating and to effectively utilize the performance of the wafer 1 formed of the wide bandgap semiconductor.

As described above, according to the present embodiment, a profile of an etching amount can be smoothed by preventing an inflection point of the etching amount from occurring not only in the vicinity of the rotation axis 1a but also on the entire surface of the wafer 1. Therefore, uniformity of the etching amount can be enhanced. As a result, the residual thickness of the object to be etched cannot easily deviate from the standard, and a risk that the electrical characteristic of the semiconductor device deteriorates can be reduced.

Meanwhile, technical features explained in this embodiment may be appropriately combined to use.

In the semiconductor manufacturing apparatus and the method of manufacturing the semiconductor device according to the present disclosure, in-plane uniformity can be enhanced by moving a nozzle that supplies a chemical solution along a first trajectory and a second trajectory.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-067257, filed on Apr. 12, 2021 including specification, claims, drawings and summary, on which the Convention priority of the present application is based, are incorporated herein by reference in its entirety.

The invention claimed is:
1. A semiconductor manufacturing apparatus comprising:
a rotation stage that rotates a wafer;
a nozzle that supplies a chemical solution to a processing surface of the wafer;
a nozzle mover that moves the nozzle on such a scan trajectory as to cross the processing surface in a planar view above the processing surface; and
a controller configured to control movement of the nozzle mover, wherein
the nozzle mover is controlled by the controller which is configured to move the nozzle along at least one first trajectory and at least one second trajectory on the scan trajectory so that the wafer is etched with the chemical solution, the at least one first trajectory is a trajectory to turn around at a first turnaround point on one side and a second turnaround point on the other side with respect to a portion closest to a rotation axis of the rotation stage in the scan trajectory, and the at least one second trajectory is a trajectory to turn around at a third turnaround point on the scan trajectory and a fourth turnaround point provided on the same side as the third turnaround point with respect to the portion closest to the rotation axis in the scan trajectory.

2. The semiconductor manufacturing apparatus according to claim 1, wherein the first turnaround point and the second turnaround point are provided outside a central region as a predetermined range from the rotation axis in a planar view, and the at least one second trajectory is provided outside the central region in a planar view.

3. The semiconductor manufacturing apparatus according to claim 2, wherein when etching is performed along the first trajectory, an etching amount increases or decreases as a distance from the rotation axis increases, and the central region is a range from the rotation axis to a location where the increase or decrease of the etching amount stops.

4. The semiconductor manufacturing apparatus according to claim 2, wherein there are a plurality of first and second trajectories, and when the plurality of first trajectories that differ in the first turnaround point or the second turnaround point are switched, when the plurality of second trajectories that differ in the third turnaround point or the fourth turnaround point are switched, or when the first trajectories and the second trajectories are switched, the controller configured to cause the nozzle mover, if the turnaround point of the trajectory after the switching exists in a movement direction of the nozzle at the time of the switching, to move the nozzle to turn around at the turnaround point, and causes the nozzle mover, if the turnaround point of the trajectory after the switching does not exist in the movement direction of the nozzle at the time of switching, to move the nozzle to turn around at a time point where the nozzle goes out of the central region.

5. The semiconductor manufacturing apparatus according to claim 1, wherein there is a plurality of first trajectories, and the nozzle mover is controlled by the controller which is configured to move the nozzle along the plurality of first trajectories that differ in the first turnaround point or the second turnaround point.

6. The semiconductor manufacturing apparatus according to claim 1, wherein there is a plurality of second trajectories, and the nozzle mover is controlled by the controller which is configured to move the nozzle along the plurality of second trajectories that differ in the third turnaround point or the fourth turnaround point.

7. The semiconductor manufacturing apparatus according to claim 1, wherein the controller is configured to control the nozzle mover depending on a processing recipe including a plurality of steps, wherein the first turnaround point and the second turnaround point or the third turnaround point and the fourth turnaround point can be set for each of the plurality of steps of the processing recipe.

8. The semiconductor manufacturing apparatus according to claim 1, wherein the controller is configured to move the nozzle mover such that the nozzle moves along the at least one first trajectory and the at least one second trajectory in order, and finally moves the nozzle along the trajectory having best uniformity among the at least one first trajectory and the at least one second trajectory.

9. The semiconductor manufacturing apparatus according to claim 1, wherein the wafer is made with a wide bandgap semiconductor.

10. The semiconductor manufacturing apparatus according to claim 9, wherein the wide bandgap semiconductor is silicon carbide, gallium-nitride-based material or diamond.

* * * * *